(12) United States Patent
Iwasa

(10) Patent No.: US 8,003,472 B2
(45) Date of Patent: Aug. 23, 2011

(54) METHOD OF MANUFACTURING SEMICONDUCTOR DEVICE

(75) Inventor: Shinya Iwasa, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/856,105

(22) Filed: Aug. 13, 2010

(65) Prior Publication Data

US 2011/0053330 A1    Mar. 3, 2011

(30) Foreign Application Priority Data

Aug. 27, 2009   (JP) ................................. 2009-196689

(51) Int. Cl.
*H01L 21/336* (2006.01)

(52) U.S. Cl. ................. 438/300; 438/301; 257/E21.409

(58) Field of Classification Search ................. 438/300, 438/301; 257/E21.409
See application file for complete search history.

(56) References Cited

U.S. PATENT DOCUMENTS

| | | | | |
|---|---|---|---|---|
| 2002/0192930 A1* | 12/2002 | Rhee et al. | ..................... | 438/504 |
| 2007/0090466 A1* | 4/2007 | Park et al. | ..................... | 257/382 |

FOREIGN PATENT DOCUMENTS

| JP | 2000-049348 A | 2/2000 |
|---|---|---|
| JP | 2003-338542 A | 11/2003 |

* cited by examiner

*Primary Examiner* — Alexander G Ghyka
*Assistant Examiner* — Seahvosh J Nikmanesh
(74) *Attorney, Agent, or Firm* — Sughrue Mion, PLLC

(57) ABSTRACT

When transistors having different gate lengths are formed on one substrate and an ESD structure is applied to at least a transistor having longer gate length, a method including: depositing a gate insulating film and a gate electrode material layer on the substrate; forming a first gate electrode having a longer gate length in a first region; forming a first insulating film on a whole surface; forming a second gate electrode including the first insulating film and having a shorter gate length in a second region; forming a second insulating film on a whole surface; forming second sidewalls made of the second insulating film on sidewalls of the second gate electrode; forming first sidewalls made of the first and second insulating films on sidewalls of the first gate electrode; forming a selectively epitaxially grown layer on at least exposed substrate of the first region and implanting ions into the substrate via the selectively epitaxially grown layer, thereby forming an ESD structure.

13 Claims, 4 Drawing Sheets

METHOD OF MANUFACTURING SEMICONDUCTOR DEVICE

BACKGROUND OF THE INVENTION

1. Field of the Invention

Figure 1:
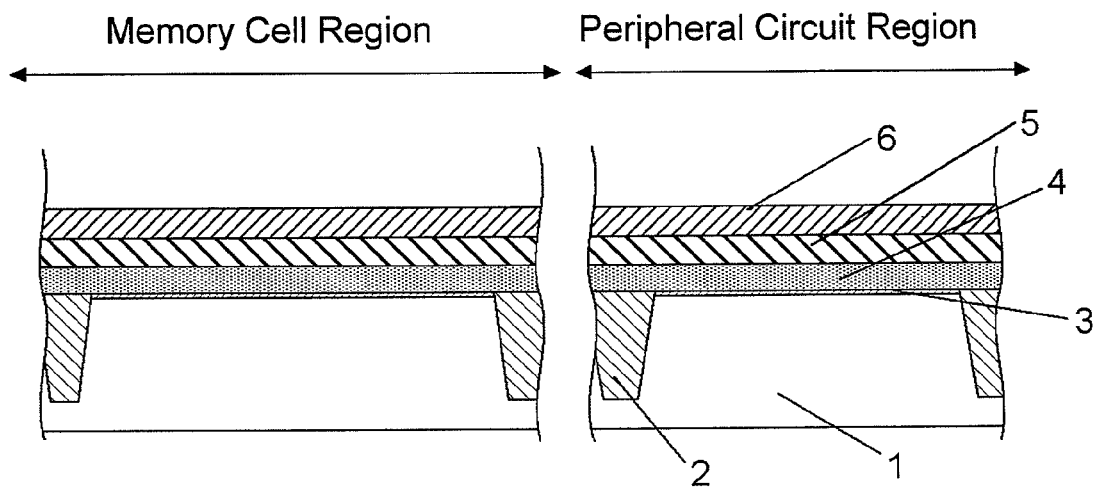

The present invention relates to a method of manufacturing a semiconductor device, and more particularly, to a method of manufacturing a semiconductor device including a transistor (ESD-Tr) having an Elevated Source Drain (ESD) (it is also referred to as Raised Source Drain (RSD)) structure.

2. Description of the Related Art

In a semiconductor device, transistors having different gate lengths are frequently provided as mixed on a single substrate.

For example, in the semiconductor device such as DRAM (Dynamic Random Access Memory), memory cell transistors that are connected to memory devices such as capacitors, transistors of array circuits (X and Y decoders) for controlling memory cells and transistors for peripheral circuits for controlling the array circuits and input/output of data are formed on a semiconductor substrate. Generally, transistors finer (having a shorter gate length) than the transistors of the array circuit and the peripheral circuit are formed in a memory cell region, from a standpoint of providing cells in a predetermined area of the memory cell region as much as possible.

Conventionally, the transistors of the array circuit and the peripheral circuit (hereinafter, the transistors of the array circuit and the peripheral circuit are commonly referred to as "peripheral circuit transistors"), for which a high speed operation is required, are generally formed with high concentration diffusion layers to reduce resistance of source/drain. When the high concentration diffusion layer is formed, a short-channel effect which results from diffusion of impurities to a channel becomes actually evident. In order to prevent the short-channel effect, it has been suggested to provide a LDD (Lightly Doped Drain) structure or extension area. Furthermore, as a generation of semiconductor device development is advanced, it is required to form the source/drain shallower from a surface of the substrate than ever before.

Accordingly, a structure has been suggested in which epitaxially grown silicon layers are formed on the source/drain and the source/drain area is elevated beyond the original substrate surface, thereby becoming a junction depth from the substrate surface shallower, while securing a substantial junction depth of the source/drain area. Such a structure is referred to as an ESD structure.

In order to form an ESD structure, the following method is generally used. A gate electrode is first formed on a substrate and a shallow diffusion layer (low concentration diffusion layer) is formed by using the gate electrode as a mask. Continuously, sidewall insulating films are formed on sidewalls of the gate electrode, an epitaxially grown silicon layer is formed on an exposed surface of the substrate, and impurity ion implantation for forming a high concentration diffusion layer is performed to form high concentration diffusion layers in the epitaxially grown silicon layer and the substrate surface.

At this time, it is known that when a silicon oxide film is formed as the sidewall insulating film, the growth of the epitaxially grown silicon layer is impeded at a contact surface with the silicon oxide film and a facet is thus formed (refer to JP-A No. 2000-49348). When the ion implantation for forming a high concentration diffusion layer is performed through the epitaxially grown silicon layer with such a facet, the diffusion layer below the facet is deeper (refer to FIG. 10 in JP-A No. 2000-49348), so that problems in extended short-channel effect or increase of parasitic capacity in the diffusion layer are caused. In addition, it is disclosed in JP-A No. 2000-49348 ([0055] and [0056] paragraphs) that when a thickness of the epitaxially grown silicon layer is under about 100 nm, the facet is not generated on a sidewall insulating film made of insulating material containing nitrogen, such as silicon nitride, silicon oxynitride and the like.

Meanwhile, in order to form the cell transistors finer and in higher dense than the peripheral circuit transistors from a standpoint of increasing the memory capacity, a gate length is further reduced and a gate interval is also narrowed. Accordingly, a shallower junction is required so as to suppress the short-channel effect. Additionally, in the cell transistors that are formed to be finer and in higher dense, it is more difficult to form a contact that is connected to the diffusion layer and a process of forming a self-aligned contact (SAC method) is mainly used.

As the cell size is reduced, contact size and junction depth tend to decrease. Thereby, it is difficult to secure electric properties of the transistor, particularly contact resistance. In order to solve the problems, JP-A No. 2003-338542 discloses a landing plug structure in which an epitaxially grown single-crystal silicon layer is formed on a surface of a semiconductor substrate and polysilicon is formed thereon. The epitaxially grown single-crystal silicon layer is also referred to as a landing pad. By forming the landing pad, the increase in contact resistance due to the natural oxidation film on the substrate surface is suppressed.

In the meantime, from a standpoint of process simplification, it is generally performed to make processes of manufacturing the cell transistor and the peripheral circuit transistor common. When forming the transistor having the ESD structure and the cell contact by the SAC method, a sidewall film is commonly formed on the gate sidewall. In addition, when the landing plug structure is applied to the memory cell region, a selective epitaxial growth is commonly performed on the substrate surface. However, as the memory cell size is reduced, it is required to reduce a width of the sidewall or a thickness of the single crystal silicon layer by the selective epitaxial growth. Additionally, in the peripheral circuit transistor, it is difficult to suppress the short-channel effect by the ESD structure if requirements for the cell transistor are met.

If the cell transistor and the peripheral circuit transistor are separately produced, it is possible to produce transistors that satisfy characteristics required for each transistor. However, the number of processes is increased and the cost is also increased.

Conventionally, in a transistor to which the ESD structure is not applied, as a method of making the sidewall width of the peripheral circuit transistor thicker than the sidewall width of the cell transistor, it has been adopted a method in which a two-layered film of a silicon nitride film and a silicon oxide film is used as a sidewall film and the silicon oxide film is selectively etched from a memory cell region. However, since the lower silicon nitride film has a thickness that is suitable for a sidewall of the cell transistor and the selectively epitaxially grown silicon layer is typically formed to be thicker than its thickness, the lower silicon nitride film is grown to a thickness contacting the upper silicon oxide film. As a result, in the ESD structure, a shape involving a facet due to the selective epitaxial growth having selectivity for the silicon oxide film is regenerated, as described above.

SUMMARY

Accordingly, for a case where transistors having different gate lengths such as memory cell transistor and peripheral circuit transistor are formed on a single substrate and at least an ESD structure is applied to the transistor having a longer gate length, it is required to suppress generation of a facet and to form sidewalls suitable for each transistor, thereby suppressing the short-channel effect.

According to an exemplary embodiment of the invention, there is provided a method of manufacturing a semiconductor device in which a first transistor and a second transistor having a gate length different from that of the first transistor are respectively formed in a first region and a second region on a semiconductor substrate, the first and second regions being element-isolated. The method includes:

forming a first region and a second region in a semiconductor substrate, the first and second regions being element-isolated;

depositing a gate electrode material layer on the semiconductor substrate via a gate insulating film;

processing the gate electrode material layer of the first region into a first gate electrode;

implanting ions into the first region while using the first gate electrode as a mask, thereby forming a first LDD diffusion layer for a first transistor;

depositing a first insulating film on a whole surface;

processing the gate electrode material layer and the first insulating film over the second region into a second gate electrode having a gate length shorter than that of the first gate electrode;

implanting ions into the second region while using the second gate electrode as a mask, thereby forming a second LDD diffusion layer for a second transistor;

depositing a second insulating film on a whole surface;

processing the second insulating film over the second region into second sidewalls of the second gate electrode;

processing the second insulating film and the first insulating film over the first region into first sidewalls of the first gate electrode;

selectively epitaxially growing a semiconductor layer on at least the first LDD diffusion layer exposed from the first sidewalls of the first region; and implanting ions into the semiconductor substrate via the semiconductor layer of the first region, thereby forming an elevated source/drain structure, wherein the first insulating film and the second insulating film are films that do not inhibit the growth of the semiconductor layer.

In addition, according to an exemplary embodiment of the invention, there is provided a method of manufacturing a semiconductor device including a DRAM having a memory cell region and a peripheral circuit region on a semiconductor substrate. The method includes:

forming a gate electrode material layer on the semiconductor substrate via a gate insulating film;

processing the gate electrode material layer of the peripheral circuit region into a first gate electrode;

implanting ions into the semiconductor substrate of the peripheral circuit region while using the first gate electrode as a mask, thereby forming a first LDD diffusion layer for a peripheral circuit transistor;

forming a first insulating film on a whole surface;

processing the gate electrode material layer and the first insulating film of the memory cell region into a second gate electrode;

implanting ions into the semiconductor substrate of the memory cell region while using the second gate electrode as a mask, thereby forming a second LDD diffusion layer for a memory cell transistor;

forming a second insulating film on a whole surface;

processing the second insulating film of the memory cell region into second sidewalls of the second gate electrode;

processing the second insulating film and the first insulating film of the peripheral circuit region into first sidewalls of the first gate electrode;

selectively epitaxially growing a semiconductor layer on the first LDD diffusion layer and the second LDD diffusion layer; and implanting ions into the semiconductor substrate via the semiconductor layer of the peripheral circuit region, thereby forming an elevated source/drain structure, wherein the first insulating film and the second insulating film are films that do not inhibit the growth of the semiconductor layer.

In the transistors having different gate lengths, it is possible to form the sidewalls suitable for each transistor with films that do not inhibit the growth of the selectively epitaxially grown semiconductor layer, such as silicon nitride films and to form a raised semiconductor layer having a flat surface without inhibiting the selective epitaxial growth. As a result, it is possible to make a depth of the diffusion layer into shallow and uniform, thereby suppressing the short-channel effect and improving the capacity of the transistors.

BRIEF DESCRIPTIONS OF THE DRAWINGS

The above features and advantages of the present invention will be more apparent from the following description of certain preferred embodiments taken in conjunction with the accompanying drawings, in which:

FIGS. 1 to 11 are sectional views showing a process of manufacturing a DRAM for illustrating an exemplary embodiment of the invention.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purpose.

FIGS. 1 to 11 are sectional views showing a process of manufacturing a DRAM, particularly a process of forming a transistor, for illustrating an exemplary embodiment of the invention. In the drawings, a left side indicates a memory cell region and a right side indicates a peripheral circuit region. The peripheral circuit region includes an array circuit region, too.

FIG. 1 (Deposition of Gate Electrode Material)

A well area (not shown) is formed in semiconductor substrate 1. Herein, a silicon substrate is used as the semiconductor substrate. Herein, a P-type well is formed. Then, element isolation region 2 that divides active regions is formed on a surface of the semiconductor substrate. Then, gate insulating film 3, gate polysilicon film 4, tungsten silicide film 5 and mask insulating film 6 are sequentially formed. Gate insulating film 3 is formed to have a thickness of about 5 nm with a silicon oxide film. As gate insulating film 3, a silicon oxynitride film and the like may be used. Gate polysilicon film 4 is formed by growing a p-doped silicon film to have a thickness of about 40 nm by a CVD method. Tungsten silicide film 5 is formed to have a thickness of about 40 nm by the CVD method. Mask insulating film 6 is formed to have a thickness of about 100 nm with a silicon nitride film by the CVD method.

Figure 2:
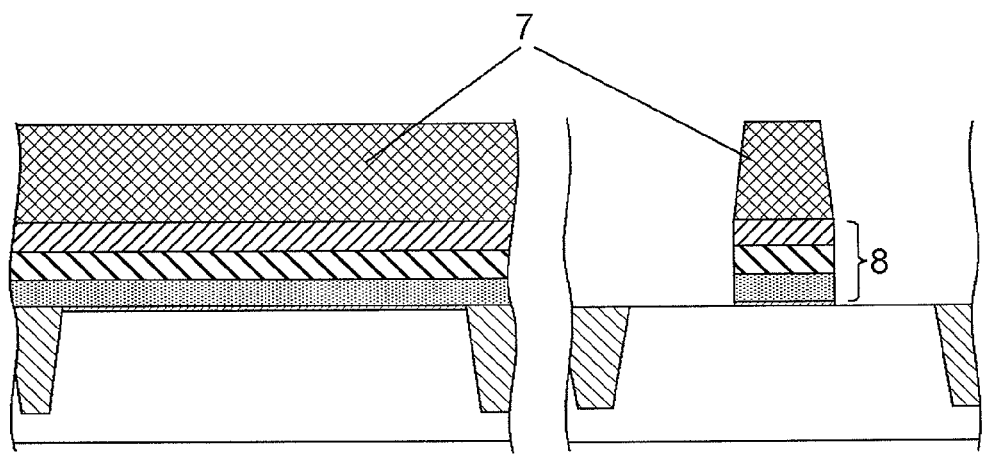

FIG. 2 (First Gate Electrode Processing)

After forming first photoresist film 7, a gate electrode of a transistor of the peripheral circuit region is patterned with a photolithography technique. Mask insulating film 6, tungsten silicide film 5 and gate polysilicon film 4 are sequentially patterned with a dry etching technique. By the above process, first gate electrode 8 having a gate length of about 100 nm is formed in the peripheral circuit region.

Figure 3:
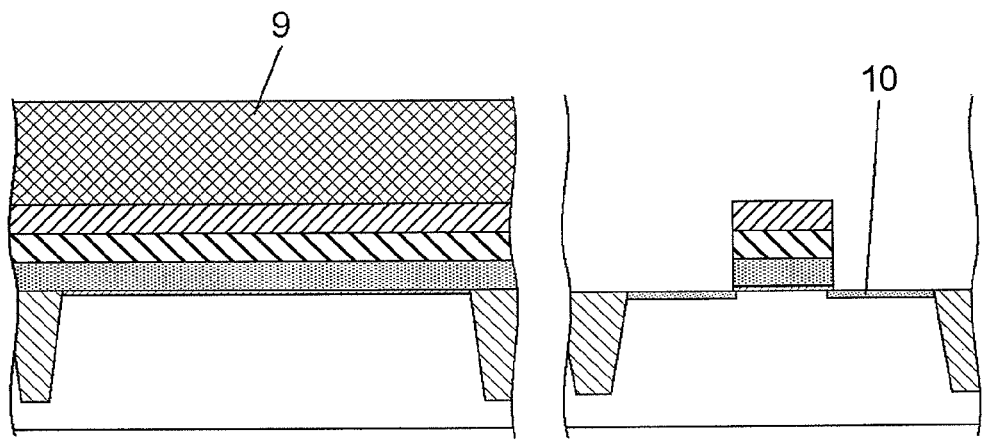

FIG. 3 (Formation of First LDD)

After removing first photoresist film 7 and forming second photoresist film 9, the photolithography technique is applied to the second photoresist film to open the peripheral circuit region, thereby forming a mask. With the mask, impurities are ion-implanted into the semiconductor substrate to form first LDD diffusion layers 10 for the peripheral circuit transistor. The ion implantation was performed using phosphorous under conditions of the energy of 10 KeV and the dose of $1.5 \times 10^{13}$ atoms/cm$^2$.

Figure 4:
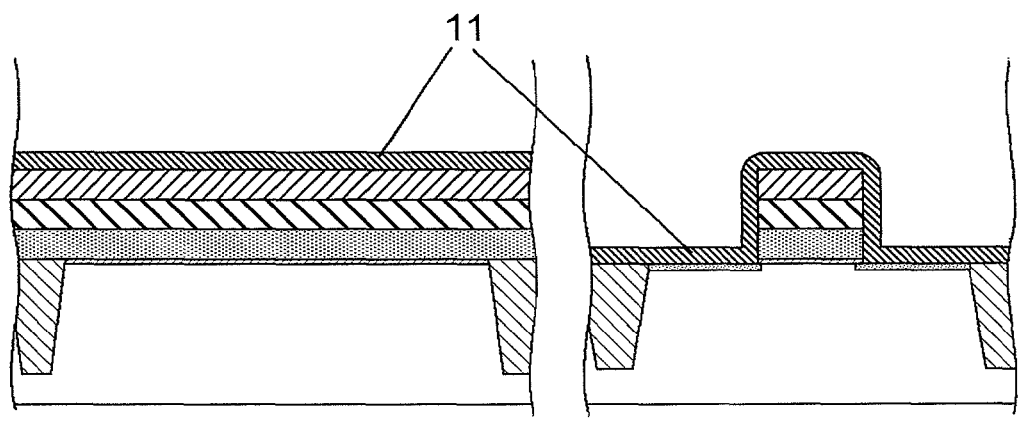

FIG. 4 (Formation of First Insulating Film for Sidewall)

After removing second photoresist film 9, first insulating film 11 for a sidewall is grown. As the first insulating film, a silicon nitride film was used. The first insulating film was formed to a thickness of about 30 nm by the CVD method. In the memory cell region, first insulating film 11 is formed on mask insulating film 6. In the peripheral circuit region, the first insulating film is formed to cover the upper surface of the semiconductor substrate and side and upper surfaces of first gate electrode 8.

Figure 5:
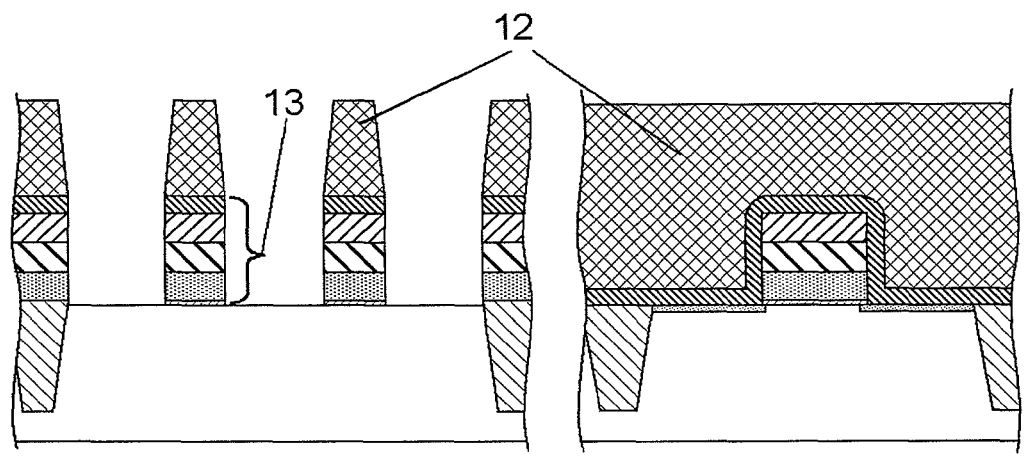

FIG. 5 (Second Gate Electrode Processing)

After forming third photoresist film 12, a gate electrode of a transistor of the memory cell region is patterned with the photolithography technique. Gate electrodes having a gate length of about 60 nm and a gate interval of about 90 nm were formed with a pitch of about 50 nm. First insulating film 11, mask insulating film 6, tungsten silicide film 5 and gate polysilicon film 4 are sequentially patterned with the dry etching technique. By the above process, second gate electrodes 8 having a gate length of about 60 nm are formed in the memory cell region.

Figure 6:
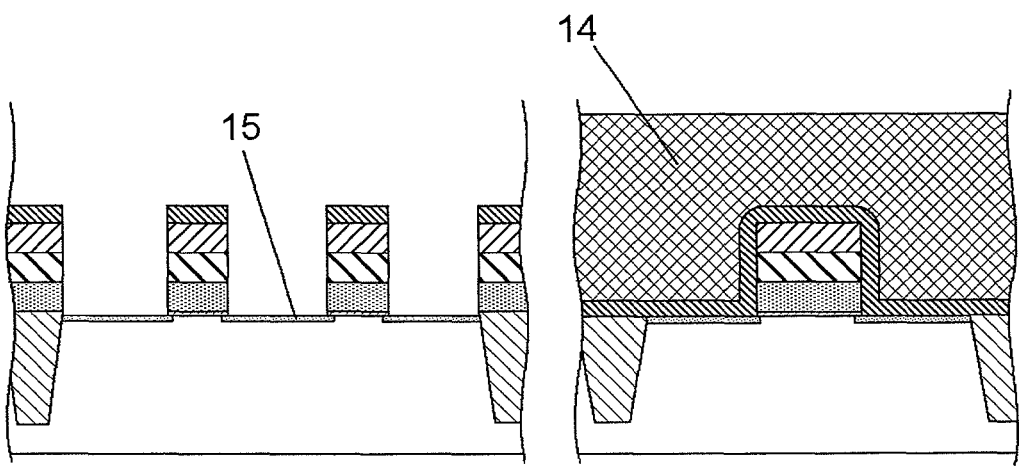

FIG. 6 (Formation of Second LDD)

After removing third photoresist film 12 and forming fourth photoresist film 14, the photolithography technique is applied to the fourth photoresist film to form a mask opening the memory cell region. With the mask, impurities are ion-implanted into the semiconductor substrate to form second LDD diffusion layers 15 for the transistors of the memory cell region. The ion implantation was performed using phosphorous under conditions of the energy of 10 KeV and the dose of $1.5 \times 10^{13}$ atoms/cm$^2$.

Figure 7:
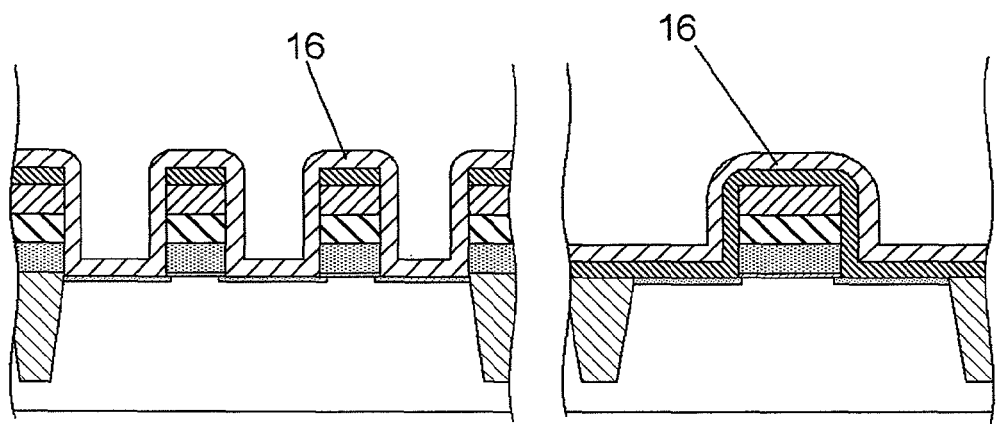

FIG. 7 (Formation of Second Insulating Film for Sidewall)

After removing fourth photoresist film 14, second insulating film 16 that will be a sidewall film is grown. As second insulating film 16, a silicon nitride film was used. The second insulating film was formed to have a thickness of about 30 nm by the CVD method. The second insulating film is formed to cover the upper surface of semiconductor substrate 1 and side and upper surfaces of first gate electrode 8 and second gate electrodes 13.

Figure 8:
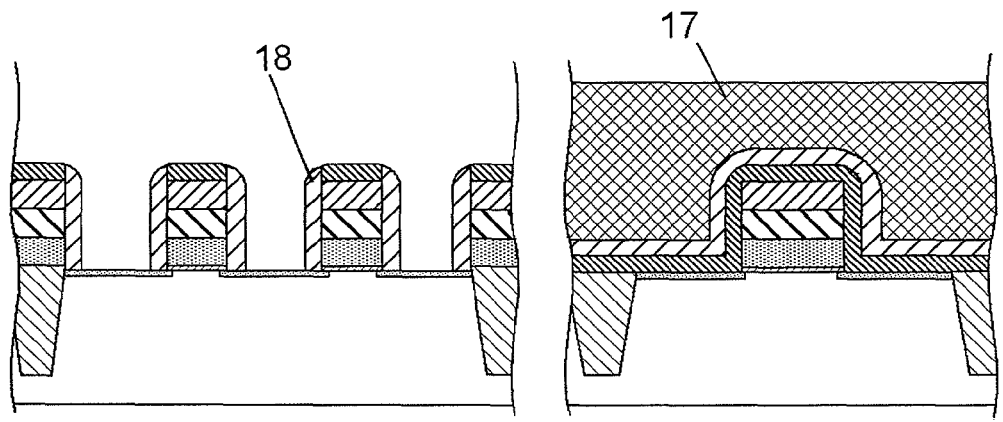

FIG. 8 (Formation of Second Sidewall)

After forming fifth photoresist film 17, the photolithography technique is applied to fifth photoresist film 17 to form a mask opening the memory cell region. With the mask, an etch back is performed for the second insulating film 16, thereby forming second sidewall films 18 on sidewalls of second gate electrodes 13 in the memory cell region. Second sidewall films 18 are comprised of second insulating film 16. A horizontal width of the sidewall film is approximately the same as the thickness of second insulating film 16, i.e., about 30 nm.

Figure 9:
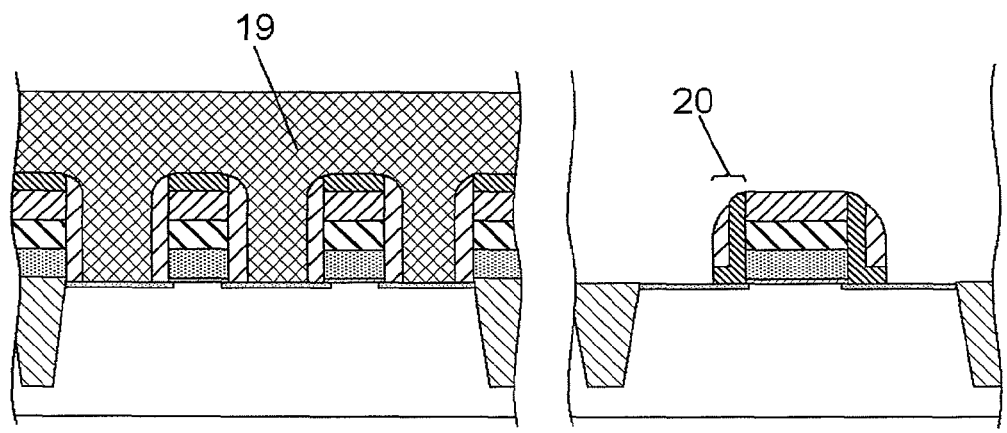

FIG. 9 (Formation of First Sidewall)

After removing fifth photoresist film 17 and forming sixth photoresist film 19, the photolithography technique is applied to sixth photoresist film 19 to form a mask opening the peripheral circuit region. With the mask, the etch back is sequentially performed for second insulating film 16 and first insulating film 11, thereby forming first sidewall films 20 on sidewalls of first gate electrode 8 in the peripheral circuit region. First sidewall film 20 is comprised of a stacked film of first insulating film 11 and second insulating film 16 from the below. A horizontal width of the first sidewall film is approximately the same as a sum of the film thickness of first insulating film 11 and second insulating film 16, i.e., about 60 nm.

Figure 10:
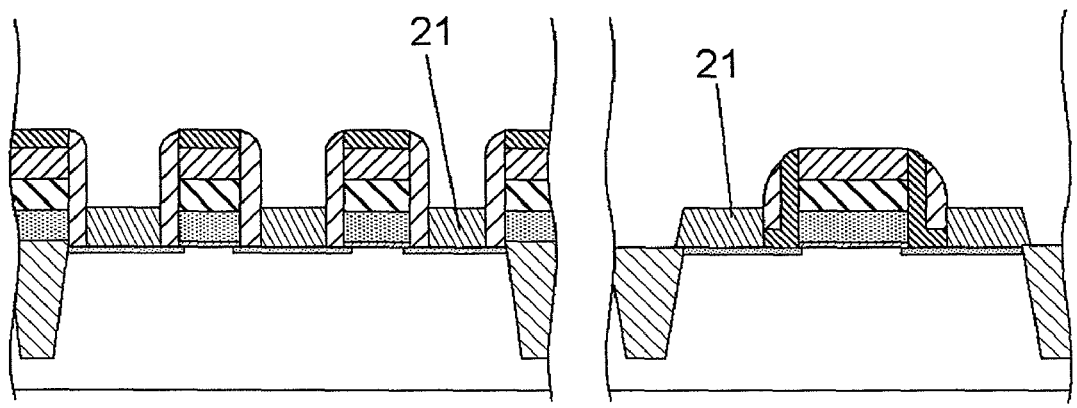

FIG. 10 (Selective Epitaxial Growth)

After removing sixth photoresist film 19, a chemical solution such as hydrofluoric acid solution having low etching rate is used to clean the surfaces of the first and second insulating films covering semiconductor substrate 1, first gate electrode 8 and second gate electrodes 13 and to remove the oxide film and the like, thereby exposing the surface of the semiconductor substrate. Epitaxial silicon layers 21 are grown on the exposed semiconductor substrate with a vapor selective epitaxial growth method. For growth, gas including dichloro silane and hydrochloric acid was used. Epitaxial silicon layers 21 were grown to have a thickness of about 50 nm.

In the memory cell region, epitaxial silicon layers 21 are formed from the exposed surface of the semiconductor substrate along second sidewall films 18 in a direction perpendicular to the substrate. Upper surfaces of the epitaxial silicon layers grown along second sidewall films 18 are formed approximately flat without a facet.

In the peripheral circuit region, epitaxial silicon layers 21 are formed from the exposed surface of the semiconductor substrate along first sidewall films 20 in a direction perpendicular to the substrate. First sidewall film 20 is comprised of the first insulating film made of silicon nitride film and having a thickness of about 30 nm and the second insulating film made of silicon nitride film formed on the first insulating film, from the below. Epitaxial silicon layers 21 are grown along first sidewall films 20. Upper surfaces of epitaxial silicon layers 21 are formed approximately flat without a facet. In FIG. 10, although epitaxial silicon layers 21 are grown to a height at which the second insulating film exists, a facet is not formed.

Figure 11:
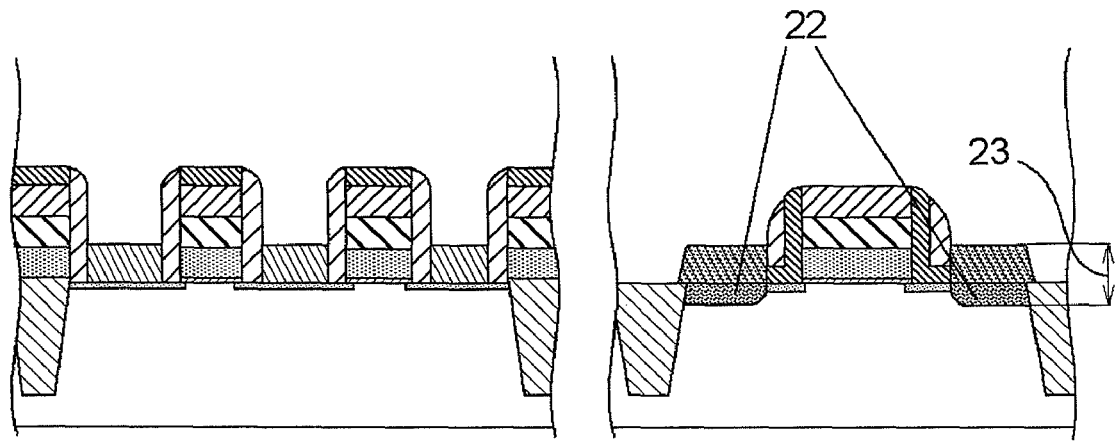

FIG. 11 (Formation of ESD Structure)

Impurities are ion-implanted into epitaxial silicon layers 21 and the semiconductor substrate of the peripheral circuit region to form source/drain diffusion layers 22. The ion implantation was performed using arsenic under conditions of the energy of 10 KeV and the dose of $1.5 \times 10^{15}$ atoms/cm$^2$. After the ion implantation, an activation annealing of the impurities was performed using rapid heat treatment at 1,000° C. for 10 sec.

As described in the process of FIG. 10, the upper surfaces of epitaxial silicon layers 21 grown along first sidewall films 20 are formed approximately flat without a facet. By the ion implantation, shallow source/drain diffusion layers 22 can be formed without a problem that a diffusion layer is deeply formed in a semiconductor substrate area located below a gate end. ESD structure 23 is comprised of shallow source/drain diffusion layer 22 and ion-implanted epitaxial silicon layer 21.

After the process of FIG. 11, an interlayer insulating film, a contact, a wiring and the like are formed to complete a device. In the memory cell region, the contact can be formed by a SAC method using second sidewall films 18. Regarding epitaxial silicon layers 21 in the memory cell region, a separate ion implantation may be performed so as to reduce the contact resistance, a cell contact plug may be formed of doped polysilicon (DOPOS) and the impurity ions may be diffused from the DOPOS by the solid-state diffusion. As a result, epitaxial silicon layers 21 formed as a landing pad also have a so-called ESD structure.

According to the method of the invention, the sidewall films having a narrow width are formed in the transistor of the memory cell region in which the gate electrodes are formed with a narrow pitch. In the meantime, the sidewall films thicker than the sidewall films formed in the memory cell are formed in the transistor of the peripheral circuit transistor in which the high concentration diffusion layers are formed. As the sidewall films in the peripheral circuit region are comprised of silicon nitride films having a two-layered structure, the selective epitaxial layers suppressing a facet are obtained, the short-channel effect can be suppressed and performance of the transistor can be improved. When it is desired to form sidewalls having widths suitable for each transistor, it has only to make second insulating film 16, which will be the sidewalls for a memory cell transistor, have a thickness suitable for the memory cell transistor, and to adjust a thickness of first insulating film 11 in the transistor of the peripheral circuit region, thereby making a total thickness of first insulating film 11 and second insulting film 16 be a sidewall width suitable for the transistor of the peripheral circuit region.

Additionally, in the cell transistor, it is possible to form a contact by the SAC method in which second sidewall films 18 are used as a mask, to realize a landing plug structure by epitaxial silicon layers 21 and to suppress the increase in contact resistance. Particularly, in the cell transistor, first insulating film 11 is left as a mask insulating film, which is enabled to serve as an etching stopper when forming the cell contact plug by the SAC method. Further, compared to solo mask insulating film 6, it is possible to form the contact more safely. In addition, when embedding the cell contact plug by a CMP method, first insulating film 11 serves as a CMP stopper, thereby reducing an influence on the peripheral circuit region. Additionally, in the memory cell region, the selectively epitaxially grown semiconductor layer is not necessarily required and may not be formed when there is no problem regarding the contract resistance and the like.

In this exemplary embodiment, the NMOS transistor has been described. However, the invention may be also applied to a PMOS transistor. Furthermore, it is possible to form a CMOS structure in the peripheral circuit region.

In this exemplary embodiment, the silicon nitride film was used as the first and second insulating films. However, the invention is not limited thereto. For example, in the vapor epitaxial silicon growth, an insulating film, which has higher wettability than the silicon oxide film and does not inhibit the selective epitaxial growth, for example silicon oxynitride film having a high content of nitrogen can be used for the epitaxial silicon film.

In this exemplary embodiment, the so-called "polycide" structure, in which tungsten silicide is formed on the polysilicon layer, has been adopted as the gate electrode structure. However, a "polymetal" structure in which a metal layer of tungsten and like is formed on the polysilicon layer and the other known structures can be adopted.

In the above, the transistors having different gate lengths in the memory cell region and the peripheral circuit region of a DRAM have been described. However, the invention is not limited. For example, the invention can be applied to a semiconductor device in which a plurality of transistors having different gate lengths is provided as mixed on a single substrate and an ESD structure is adopted in at least a transistor having a longer gate length.

What is claimed is:

1. A method of manufacturing a semiconductor device comprising:
    forming a first region and a second region in a semiconductor substrate, the first and second regions being element-isolated;
    depositing a gate electrode material layer on the semiconductor substrate via a gate insulating film;
    processing the gate electrode material layer of the first region into a first gate electrode;
    implanting ions into the first region while using the first gate electrode as a mask, thereby forming a first LDD diffusion layer for a first transistor;
    depositing a first insulating film on a whole surface;
    processing the gate electrode material layer and the first insulating film over the second region into a second gate electrode having a gate length shorter than that of the first gate electrode;
    implanting ions into the second region while using the second gate electrode as a mask, thereby forming a second LDD diffusion layer for a second transistor;
    depositing a second insulating film on a whole surface;
    processing the second insulating film over the second region into second sidewalls of the second gate electrode;
    processing the second insulating film and the first insulating film over the first region into first sidewalls of the first gate electrode;
    selectively epitaxially growing a semiconductor layer on at least the first LDD diffusion layer exposed from the first sidewalls of the first region; and
    implanting ions into the semiconductor substrate via the semiconductor layer of the first region, thereby forming an elevated source/drain structure,
    wherein the first insulating film and the second insulating film are films that do not inhibit the growth of the semiconductor layer.

2. The method according to claim 1, wherein the second insulating film has a thickness suitable for the second sidewall of the second gate electrode and the first insulating film has such a thickness that a sum of the thickness of the first insulating film and the thickness of the second insulating film is suitable for the first sidewall of the first gate electrode.

3. The method according to claim 2, wherein the semiconductor layer is grown to have a thickness thicker than that of the first insulating film.

4. The method according to claim 1, wherein the semiconductor layer is a silicon layer and the first and second insulating films are silicon nitride films.

5. The method according to claim 1, wherein a semiconductor layer is selectively epitaxially grown on the second LDD diffusion layer of the second region.

6. The method according to claim 5, wherein the selective epitaxial growth of the semiconductor layer on the second LDD diffusion layer is simultaneously performed with the selective epitaxial growth of the semiconductor layer on the first LDD diffusion layer.

7. A method of manufacturing a semiconductor device comprising a DRAM having a memory cell region and a peripheral circuit region on a semiconductor substrate, the method comprising:
    forming a gate electrode material layer on the semiconductor substrate via a gate insulating film;

processing the gate electrode material layer of the peripheral circuit region into a first gate electrode;
implanting ions into the semiconductor substrate of the peripheral circuit region while using the first gate electrode as a mask, thereby forming a first LDD diffusion layer for a peripheral circuit transistor;
forming a first insulating film on a whole surface;
processing the gate electrode material layer and the first insulating film of the memory cell region into a second gate electrode;
implanting ions into the semiconductor substrate of the memory cell region while using the second gate electrode as a mask, thereby forming a second LDD diffusion layer for a memory cell transistor;
forming a second insulating film on a whole surface;
processing the second insulating film of the memory cell region into second sidewalls of the second gate electrode;
processing the second insulating film and the first insulating film of the peripheral circuit region into first sidewalls of the first gate electrode;
selectively epitaxially growing a semiconductor layer on the first LDD diffusion layer and the second LDD diffusion layer; and
implanting ions into the semiconductor substrate via the semiconductor layer of the peripheral circuit region, thereby forming an elevated source/drain structure,
wherein the first insulating film and the second insulating film are films that do not inhibit the growth of the semiconductor layer.

8. The method according to claim 7, wherein the second insulating film has a thickness suitable for the second sidewall of the second gate electrode and the first insulating film has such a thickness that a sum of the thickness of the first insulating film and the thickness of the second insulating film is suitable for the first sidewall of the first gate electrode.

9. The method according to claim 8, wherein the semiconductor layer is grown to have a thickness thicker than that of the first insulating film.

10. The method according to claim 7, wherein the semiconductor layer is a silicon layer and the first and second insulating films are silicon nitride films.

11. The method according to claim 7, wherein a semiconductor layer is selectively epitaxially grown on the second LDD diffusion layer of the memory cell region.

12. The method according to claim 11, wherein the selective epitaxial growth of the semiconductor layer on the second LDD diffusion layer is simultaneously performed with the selective epitaxial growth of the semiconductor layer on the first LDD diffusion layer.

13. The method according to claim 11, wherein a contact connected to the diffusion layer of the memory cell transistor is formed by a self-aligned contact method using the second sidewalls as a mask and has a landing plug structure in which the semiconductor layer formed on the second LDD diffusion layer of the memory cell region is a landing pad.

* * * * *